(12) United States Patent
Lee et al.

(10) Patent No.: US 6,459,651 B1
(45) Date of Patent: Oct. 1, 2002

(54) SEMICONDUCTOR MEMORY DEVICE HAVING DATA MASKING PIN AND MEMORY SYSTEM INCLUDING THE SAME

(75) Inventors: Jae-hyeong Lee; Dong-yang Lee, both of Sungnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/886,718

(22) Filed: Jun. 21, 2001

(30) Foreign Application Priority Data

Sep. 16, 2000 (KR) .............................................. 00-54430

(51) Int. Cl.[7] .................................................. G11C 7/00
(52) U.S. Cl. ........................ 365/233; 365/193; 711/105
(58) Field of Search ................................. 365/193, 195, 365/233; 711/105

(56) References Cited

U.S. PATENT DOCUMENTS 6,104,662 A * 9/2000 Kim et al. .............. 365/230.03
6,286,077 B1 * 9/2001 Choi et al. .................. 711/105

* cited by examiner

Primary Examiner—Vu A. Le
(74) Attorney, Agent, or Firm—Mills & Onello LLP

(57) ABSTRACT

A synchronous DRAM which can mix memory modules having different organizations in a memory system and a memory system including the same are provided. The synchronous DRAM includes a data masking pin which receives a data masking signal for masking input data during writing, and outputs the same signal as a data strobe signal through the data masking pin during reading. The synchronous DRAM further includes a data masking signal input buffer for buffering the data masking signal received from the data masking pin and outputting it to an internal circuit, and an auxiliary data strobe signal output buffer for buffering an internal data strobe signal generated internally and outputting it to the data masking pin. Also, the synchronous DRAM further includes a mode register which can be controlled externally, and the auxiliary data strobe signal output buffer is controlled by an output signal of the mode register.

13 Claims, 5 Drawing Sheets

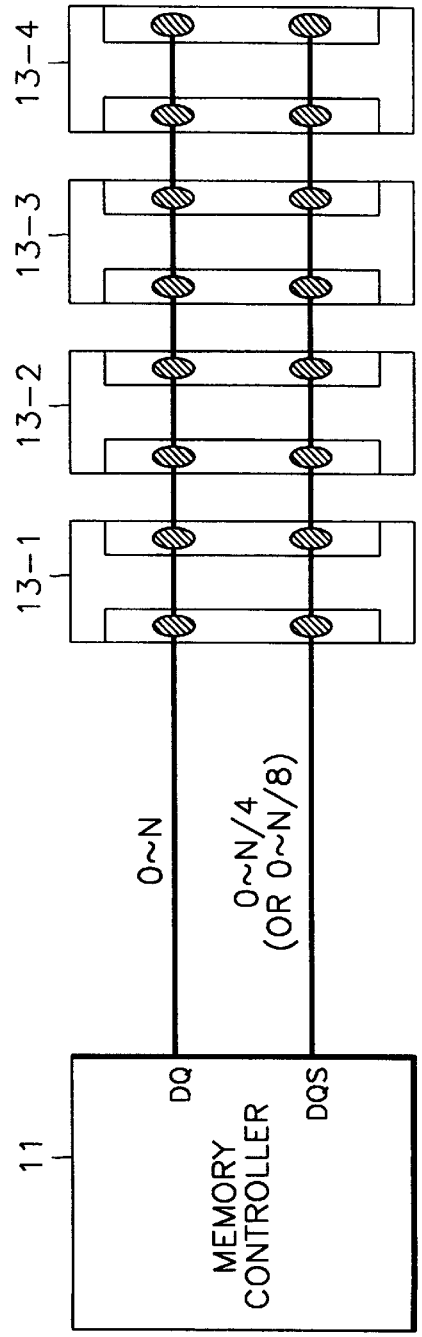
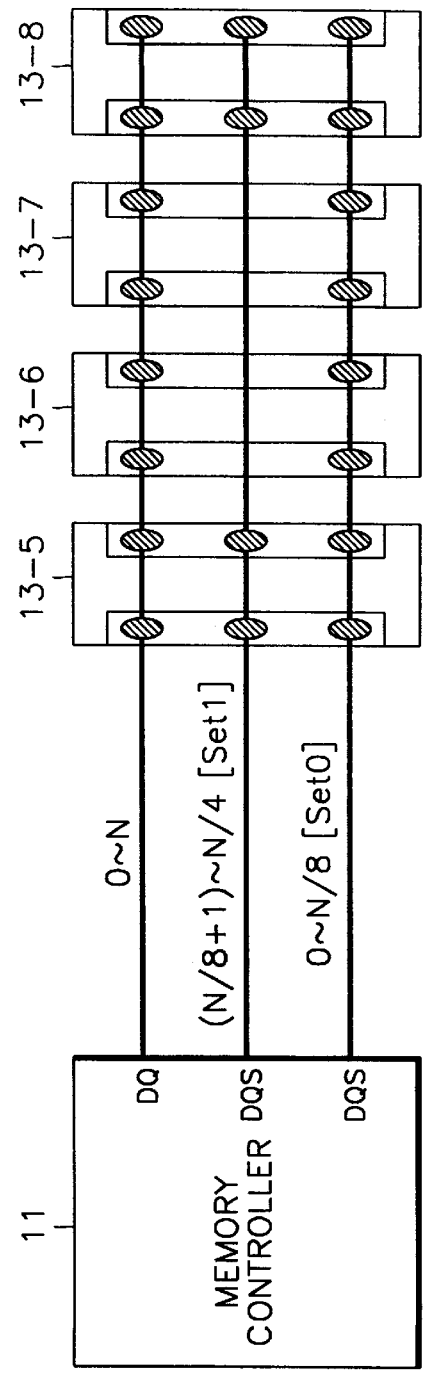
FIG. 2 (PRIOR ART)
FIG. 3 (PRIOR ART)

SEMICONDUCTOR MEMORY DEVICE HAVING DATA MASKING PIN AND MEMORY SYSTEM INCLUDING THE SAME

BACKGROUND OF THE INVENTION

1. Field of the Invention

The present invention relates to a semiconductor memory device and a memory system including the same, and more particularly, to a synchronous DRAM which can mix memory modules having different structures in a memory system and a memory system including the same.

2. Description of the Related Art

In order to increase system performance, the integration density and speed of semiconductor memory devices such as DRAM, must be increased. That is, DRAM which can process more data at faster speed is required. Accordingly, a synchronous DRAM which operates in synchronization with a system clock signal for high speed operation was developed, and the appearance of the synchronous DRAM remarkably enhanced data transmission speed.

However, in the synchronous DRAM, input and output of data must be performed within one cycle of the system clock signal, so that there is a limit to an increase in bandwidth between the synchronous DRAM and a DRAM controller, that is, there is a limit to an increase in the amount of data that can be input to and output from a memory device per unit time. Therefore, in order to further increase data transmission speed, a dual data rate (DDR) synchronous DRAM in which a rising edge and a falling edge of a data strobe signal are all synchronized to input and output data was developed.

FIG. 1 is a schematic block diagram illustrating a memory system including a DDR synchronous DRAM. Referring to FIG. 1, in a memory system including a DDR synchronous DRAM, a system clock signal (CK) generated by a clock driver 17 is transmitted to DDR synchronous DRAMs 15 on memory modules 13. An address (ADD) and a command (COM) are transmitted from a memory controller 11 to the DDR synchronous DRAMs 15 on the memory modules 13 during writing and reading operations.

Data (DQ) and a data strobe signal (DQS) are transmitted from the memory controller 11 to the DDR synchronous DRAMs 15 on the memory modules 13 during writing. The DQ and DQS signals are transmitted from the DDR synchronous DRAMs 15 on the memory modules 13 to the memory controller 11 during reading. That is, the data (DQ) and the data strobe signal (DQS) are transmitted in both directions. A data masking signal (DM) is generated in and output from the memory controller 11 during writing and transmitted to the DDR synchronous DRAMS 15 on the memory modules 13.

The data strobe signal (DQS) is a signal for strobing input and output of the data (DQ), and the data masking signal (DM) is a signal for masking predetermined data input into the DDR synchronous DRAMs 15 during writing. In general, one data strobe signal (DQS) and one data masking signal (DM) are assigned per 4 bits of data in the synchronous DRAM having x4 organization and assigned per 8 bits of data in the synchronous DRAM having x8 organization.

Therefore, as shown in FIG. 2, if a module (x4 module) including synchronous DRAMs having x4 organization is not mixed with a module (x8 module) including the synchronous DRAMs having x8 organization in the memory system shown in FIG. 1, a relationship between the data (DQ) and the data strobe signal (DQS) is always regular. That is, when memory modules (13-1 through 134) are all x4 modules, the data (DQ) is N bits, and the number of the data strobe signals (DQS) is N/4. If the memory modules (13-1 through 13-4) are all x8 modules, the data (DQ) is N, and the number of the data strobe signals (DQS) is N/8.

When data is read from each of the memory modules (13-1 through 13-4), the number of data strobe signals (DQS) transmitted from each of the memory modules (13-1 through 13-4) to the memory controller 11 is the same. The number of data strobe signals (DQS) that the memory controller 11 uses for receiving data read from each of the memory modules (13-1 through 13-4) is the same. Therefore, the memory controller 11 can easily receive data read from each of the memory modules (13-1 through 13-4) using the same number of data strobe signals (DQS).

However, as shown in FIG. 3, if the x4 module is mixed with the x8 module in the memory system shown in FIG. 1, a relationship between the data (DQ) and the data strobe signal (DQS) is irregular. Here, it is assumed that memory modules (13-5 and 13-8) are the x4 modules and memory modules (13-6 and 137) are the x8 modules.

In this case, when data is read from each of the memory modules (13-5 through 13-8), the number of data strobe signals (DQS) transmitted from the x4 modules, that is, the memory modules (13-5 and 13-8) to the memory controller 11 is different from the number of data strobe signals (DQS) transmitted from the x8 modules, that is, the memory modules (13-6 and 13-7), to the memory controller 11. The number of data strobe signals (DQS) which the memory controller 11 uses for receiving data read from the x4 modules (13-5 and 13-8) is different from the number of the data strobe signals (DQS) that the memory controller 11 uses for receiving data read from the x8 modules (13-6 and 13-7).

For example, when N bits of the data (DQ) are read from the x4 modules (13-5 and 13-8), N/4 (set0 and set1) of data strobe signals (DQS) are transmitted from the x4 modules (13-5 and 13-8) to the memory controller 11, but when N bits of the data (DQ) are read from the x8 modules (13-6 and 13-7), N/8 (set0) of the data strobe signals (DQS) are transmitted from the x8 modules (13-6 and 13-7) to the memory controller 11.

Therefore, when the x4 modules are mixed with the x8 modules in a memory system, it is difficult for the memory controller to determine which data strobe signals to use for receiving data when reading data from the modules. Therefore, memory modules having the same organization must be included in the memory system.

SUMMARY OF THE INVENTION

To solve the above problems, it is a first objective of the present invention to provide a synchronous DRAM which can mix memory modules having different organizations in a memory system.

It is a second objective of the present invention to provide a memory system in which memory modules having different organizations can be mixed.

In accordance with the invention, there is provided a semiconductor memory device, for example, a synchronous DRAM, which operates in synchronization with a system clock signal and inputs and outputs data in response to a data strobe signal. The device includes a data masking pin which receives a data masking signal for masking input data during a memory writing operation. In accordance with the invention, the same signal as the data strobe signal is output through the data masking pin during a memory reading operation.

The device of the invention can operate in synchronization with the rising edge and falling edge of the system clock signal.

In one embodiment, the synchronous DRAM further includes a data masking signal input buffer for buffering the data masking signal received through the data masking pin and outputting it to an internal circuit, and an auxiliary data strobe signal output buffer for buffering an internal data strobe signal generated internally and outputting it to the data masking pin.

The synchronous DRAM can further include a mode register which can be controlled externally, wherein the auxiliary data strobe signal output buffer is controlled by the mode register.

In accordance with another aspect, there is provided in accordance with the invention a memory system comprising at least one first memory module which operates in synchronization with a system clock signal, and inputs and outputs data in response to each of one or more data strobe signals. The system also includes at least one second memory module which operates in synchronization with the system clock signal, and inputs and outputs data in response to each of the data strobe signals. A memory controller controls the first and second memory modules, and transmits and receives data with the first and second memory modules. In accordance with the invention, the organization of the first memory module is different from that of the second memory module.

In one embodiment, the first and second memory modules operate in synchronization with a rising edge and a falling edge of the system clock signal.

In one embodiment, the organization of the first memory module is x4 organization, and the organization of the second memory module is one of x8 organization, x16 organization, and x32 organization.

Each semiconductor device included in the second memory module can include a data masking pin which receives a data masking signal from the memory controller for masking input data during writing, and outputs the same signal as the data strobe signal through the data masking pin during reading. Also, the data masking pins of the semiconductor memory devices can be connected to data strobe lines for transmitting the data strobe signal.

In one embodiment, each of the semiconductor memory devices included in the second memory module includes a data masking signal input buffer and an auxiliary data strobe signal output buffer. The data masking signal input buffer buffers the data masking signal received through the data masking pins and outputs in to an internal circuit. The auxiliary data strobe signal output buffer buffers an internal data strobe signal generated internally and outputs it to the data masking pin.

Each semiconductor device included in the second memory module can also include a mode register which can be controlled externally. The auxiliary data strobe signal output buffer can be controlled by an output signal of the mode register.

BRIEF DESCRIPTION OF THE DRAWINGS

The going and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 2 illustrates a relationship between data and a data strobe signal when modules having the same organization are used in a conventional memory system.

FIG. 3 illustrates a relationship between data and a data strobe signal when modules having different organizations are mixed in a conventional memory system.

FIG: 4 illustrates a memory system according to one embodiment of the present invention.

Figure 5:
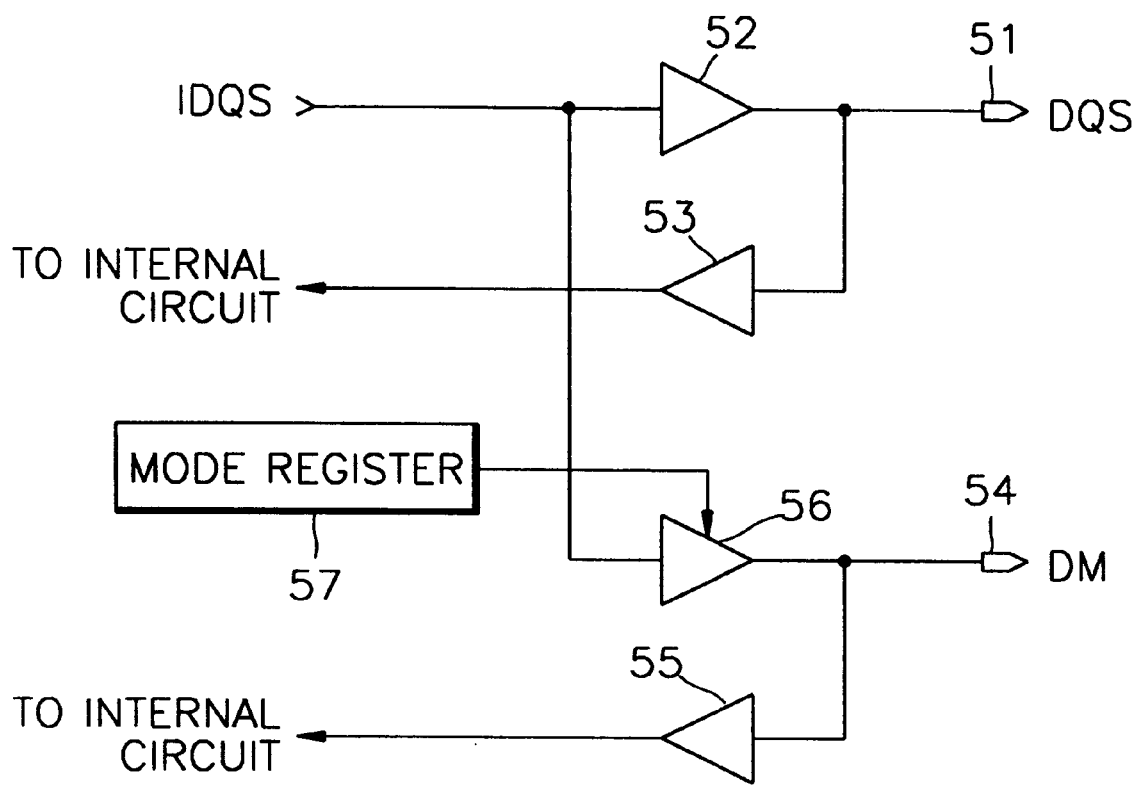

FIG. 5 is a circuit diagram illustrating a portion related to input and output of a data masking signal and a data strobe signal in a synchronous DRAM according to the present invention.

Figure 6:
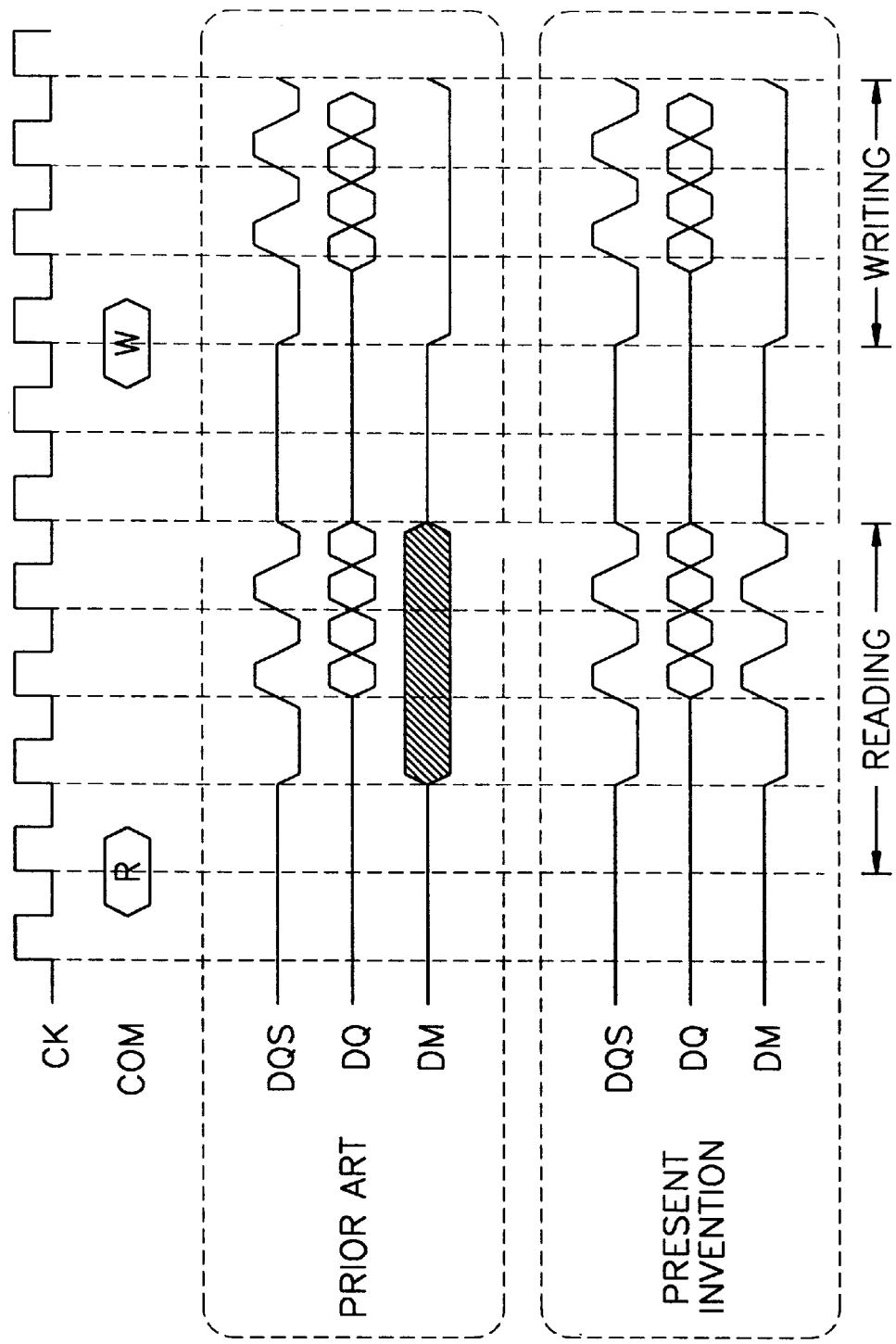

FIG. 6 is a timing chart illustrating the difference between signals in a conventional synchronous DRAM and signals in a synchronous DRAM according to the present invention.

DETAILED DESCRIPTION OF THE INVENTION

Figure 1:
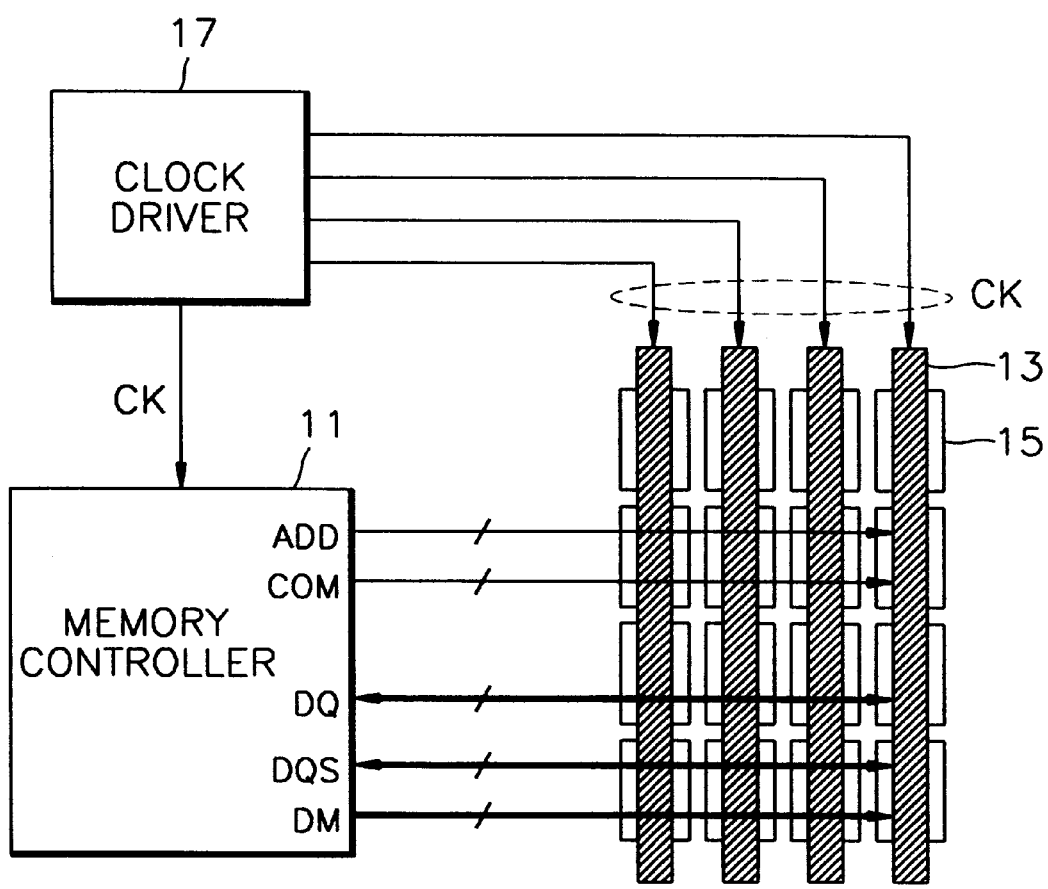
FIG. 1 is a schematic block diagram illustrating a memory system including a DDR synchronous DRAM.
Figure 4:
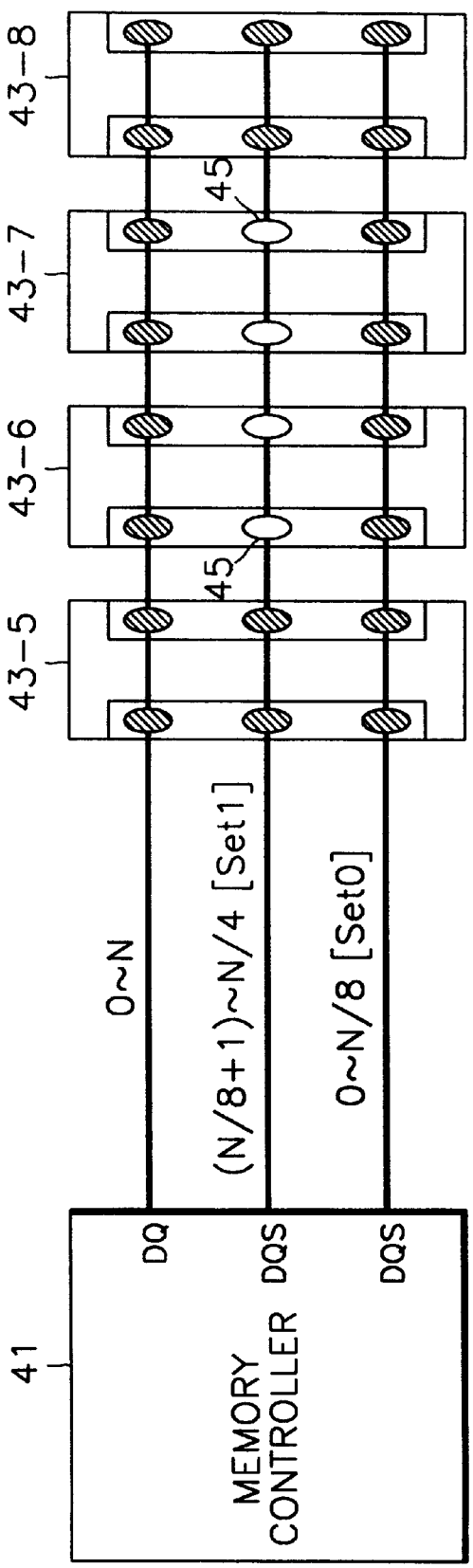

FIG. 4 illustrates a memory system according to an embodiment of the present invention. Here, it is assumed that memory modules (43-5 and 43-8) are x4 modules and memory modules (43-6 and 43-7) are x8 modules. The memory modules (43-5 through 43-8) operate in synchronization with a system clock signal, and input and output data in response to data strobe signals (DQS).

Referring to FIG. 4, data masking pins 45 of the x8 modules (43-6 and 437) are connected to data strobe lines (set 1) for transmitting the data strobe signals (DQS) in the memory system according to the present invention. More particularly, the data masking pins 45 of the x8 modules are connected to the data strobe lines (set 1) which are not connected to the x8 modules (43-6 and 43-7) in the prior art.

Meanwhile, x8 synchronous DRAMs installed on the x8 modules (43-6 and 43-7) include data masking pins which receive data masking signals for masking predetermined input data during writing, and are formed to output the same signals as the data strobe signals through the data masking pins during reading. The data masking pins of the x8 synchronous DRAMs installed on the x8 modules (43-6 and 43-7) are connected to the data masking pins 45 of the x8 modules (43-6 and 43-7).

Therefore, in the memory system according to the present invention, when N bits of data (DQ) are read from the x8 modules (43-6 and 43-7), N/8 (stet0) data strobe signals (DQS) output from the data strobe pins of the x8 modules (43-6 and 43-7) and N/8 (set1) data strobe signals (DQS) output from the data masking pins 45 of the x8 modules (43-6 and 43-7) are transmitted to a memory controller 41.

Also, when the N bit data (DQ) is read from the x4 modules (43-5 and 43-8), N/4 (set0 and set1) data strobe signals (DQS) output from the data strobe pins of the x4 modules (43-5 and 43-8) are transmitted to the memory controller 41.

Accordingly, in the memory system according to the present invention, when the x4 modules (43-5 and 43-8) are mixed with the x8 modules (43-6 and 43-7), the number of the data strobe signals (DQS) transmitted from each of the memory modules (43-5 through 43-8) to the memory controller 41 during reading is equal. That is, the number of the data strobe signals (DQS) which the memory controller 41 uses to receive data read from each of the memory modules (43-6 through 43-8) during reading is equal.

Therefore, in the memory system according to the present invention, when the x4 modules are mixed with the x8 modules, the memory controller 41 can receive data read from each of the memory modules (43-5 through 43-8) using the same number of data strobe signals (DQS).

When predetermined input data written in the x8 modules (43-6 and 43-7) during writing is masked, the data masking signals generated by the memory controller 41 are input through the data masking pins 45 of the x8 modules (43-6 and 43-7), and a data masking function can be normally performed.

FIG. 5 is a circuit diagram illustrating a portion related to input and output of a data masking signal and a data strobe signal in an x8 synchronous DRAM, which are included in the memory system shown in FIG. 4 according to the present invention. Referring to FIG. 5, the x8 synchronous DRAM according to the present invention includes a data strobe pin 51, a data strobe signal output buffer 52, a data strobe signal input buffer 53, a data masking pin 54, and a data masking signal input buffer 55. Also, the synchronous DRAM according to the present invention further includes an auxiliary data strobe signal output buffer 56 and a mode register 57 so as to mix the x4 modules with the x8 modules in the memory system shown in FIG. 4.

The data strobe signal output buffer 52 buffers an internal data strobe signal (IDQS) generated in the inside of the synchronous DRAM during reading and outputs it to the data strobe pin 51. The data strobe signal input buffer 53 receives the data strobe signal (DQS) generated by the memory controller 41 shown in FIG. 4 during writing through the data strobe pin 51, and buffers the received signal and outputs it to an internal circuit.

The data masking signal input buffer 55 receives the data masking signal (DM) generated by the memory controller 41 through the data masking pin 54 during writing, and buffers the received signal and outputs it to the internal circuit. In particular, the auxiliary data strobe signal output buffer 56 buffers the internal data strobe signal (IDQS) during reading and outputs it to the data masking pin 54. That is, during reading, the same signal as a signal output through the data strobe pin 51 is output through the data masking pin 54.

Here, it is preferable that the data strobe signal output buffer 52 and the auxiliary data strobe signal output buffer 56 be composed of the same circuit so as to reduce a phase difference between the signals output through the data strobe pin 51 and the signals output through the data masking pin 54.

The auxiliary data strobe signal output buffer 56 is preferably controlled by an output signal of the mode register 57, so that the data strobe signal output buffer 52 can be selectively controlled.

FIG. 6 is a timing chart illustrating the difference between signals of a conventional x8 synchronous DRAM and signals of an x8 synchronous DRAM according to the present invention shown in FIG. 5. Referring to FIG. 6, during writing, a signal input through the data masking pin (DM) of the conventional synchronous DRAM is equal to a signal input through the data masking pin (DM) of the synchronous DRAM according to the present invention.

However, during reading, in the conventional synchronous DRAM, the state of the data masking pin (DM) is "don't care", but, in the synchronous DRAM according to the present invention, the same signal as a signal output through the data strobe pin (DQS) is output through the data masking pin (DM).

As described above, the x8 synchronous DRAM according to the present invention has an advantage in that the x4 synchronous DRAM can be mixed with the x8 synchronous DRAM by outputting the same signal as the signal output through the data strobe pin, through the data masking pin during reading.

Also, in the memory system according to the present invention, when x4 modules are mixed with x8 modules, the number of data strobe signals transmitted from each of the memory modules to the memory controller becomes the same during reading by including the x8 synchronous DRAM according to the present invention and connecting the data masking pins of the x8 synchronous DRAMs, that is the data masking pins of the x8 modules, to the data strobe lines. Therefore, in the memory system according to the present invention, even though the x4 modules are mixed with the x8 modules, the memory controller can receive data read from each of the memory modules using the same number of data strobe signals.

As described above, the synchronous DRAM according to the present invention has an advantage in that memory modules having different organizations can be mixed in the memory system. Also, in the memory system according to the present invention, there is an advantage in that memory modules having different organizations can be mixed.

Memory systems including x4 and x8 modules and x4 and x8 synchronous DRAMs have been described, but the concept of the present invention can be applied to other size modules, including, but not limited to x4, x8, x16 and x32 modules. Also, although specific terms are employed in the preferred embodiment, they are used in a generic and descriptive sense only and not for purposes of limitation.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A semiconductor memory device which operates in synchronization with a system clock signal, and inputs and outputs data in response to a data strobe signal, the semiconductor memory device comprising a data masking pin which receives a data masking signal for masking an input data during writing, wherein the same signal as the data strobe signal is output through the data masking pin during reading.

2. The semiconductor memory device of claim 1, wherein the semiconductor memory device operates in synchronization with the rising edge and falling edge of the system clock signal.

3. The semiconductor memory device of claim 1, further comprising:
   a data masking signal input buffer for buffering the data masking signal received through the data masking pin and outputting it to an internal circuit; and
   an auxiliary data strobe signal output buffer for buffering an internal data strobe signal generated internally and outputting it to the data masking pin.

4. The semiconductor memory device of claim 3, further comprising a mode register which can be controlled externally, wherein the auxiliary data strobe signal output buffer is controlled by an output signal of the mode register.

5. A memory system comprising:
   at least one first memory module which operates in synchronization with a system clock signal, and inputs and outputs data in response to each of one or more data strobe signals;

at least one second memory module which operates in synchronization with the system clock signal, and inputs and outputs data in response to each data strobe signal; and a memory controller for controlling the first and second memory modules, and transmitting and receiving data with the first and second memory modules, wherein organization of the first memory module is different from that of the second memory module.

6. The memory system of claim 5, wherein the first and second memory modules operate in synchronization with a rising edge and a falling edge of the system clock signal.

7. The memory system of claim 5, wherein the organization of the first memory module is X4 organization, and the organization of the second memory module is X8 organization.

8. The memory system of claim 5, wherein the organization of the first memory module is X4 organization, and the organization of the second memory module is X16 organization.

9. The memory system of claim 5, wherein the organization of the first memory module is X4 organization, and the organization of the second memory module is X32 organization.

10. The memory system of claim 5, wherein each semiconductor memory device included in the second memory module includes a data masking pin which receives a data masking signal from the memory controller for masking input data during writing, and outputs the same signal as the data strobe signal through the data masking pin during reading.

11. The memory system of claim 10, wherein the data masking pins are connected to data strobe lines for transmitting the data strobe signal.

12. The memory system of claim 10, wherein each of the semiconductor memory devices further comprises:

a data masking signal input buffer for buffering the data masking signal received through the data masking pins and outputting it to an internal circuit; and an auxiliary data strobe signal output buffer for buffering an internal data strobe signal generated internally and outputting it to the data masking pin.

13. The memory system of claim 12, wherein each semiconductor device further comprises a mode register which can be controlled externally, and the auxiliary data strobe signal output buffer is controlled by an output signal of the mode register.

* * * * *